United States Patent
Senda et al.

(10) Patent No.: US 8,952,336 B2
(45) Date of Patent: Feb. 10, 2015

(54) IMAGE PICKUP DEVICE AND IMAGE PICKUP DISPLAY SYSTEM

(71) Applicant: Sony Corporation, Tokyo (JP)

(72) Inventors: Michiru Senda, Kanagawa (JP); Tsutomu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 13/777,250

(22) Filed: Feb. 26, 2013

(65) Prior Publication Data

US 2013/0256544 A1 Oct. 3, 2013

(30) Foreign Application Priority Data

Mar. 28, 2012 (JP) ................................ 2012-072895

(51) Int. Cl.
- *G01T 1/24* (2006.01)
- *H01L 27/146* (2006.01)
- *H04N 5/335* (2011.01)
- *H04N 5/378* (2011.01)

(52) U.S. Cl.
CPC .... *H01L 27/14601* (2013.01); *H01L 27/14659* (2013.01); *H04N 5/335* (2013.01); *H04N 5/378* (2013.01); *H01L 27/14609* (2013.01)
USPC .................................................. 250/370.09

(58) Field of Classification Search
USPC ................ 250/370.1–370.09, 370.11–370.15
See application file for complete search history.

(56) References Cited

U.S. PATENT DOCUMENTS

| | | | |
|---|---|---|---|
| 5,591,963 A * | 1/1997 | Takeda et al. ............... | 250/214.1 |
| 6,225,616 B1 * | 5/2001 | Park .......................... | 250/208.1 |
| 6,232,607 B1 * | 5/2001 | Huang ...................... | 250/370.09 |
| 8,193,501 B2 * | 6/2012 | Rutten et al. ............... | 250/338.4 |
| 2002/0000528 A1 * | 1/2002 | Imai .............................. | 250/580 |
| 2002/0050940 A1 * | 5/2002 | Sato et al. ...................... | 341/155 |
| 2003/0164888 A1 * | 9/2003 | Orava et al. .................... | 348/308 |
| 2004/0183025 A1 * | 9/2004 | Sato ........................ | 250/370.11 |
| 2006/0180771 A1 * | 8/2006 | Jing et al. ................. | 250/370.14 |
| 2006/0192131 A1 * | 8/2006 | Cheung et al. ............ | 250/370.14 |
| 2008/0078964 A1 * | 4/2008 | Kojima .......................... | 250/585 |
| 2009/0159806 A1 * | 6/2009 | Imai ......................... | 250/370.08 |
| 2010/0014772 A1 * | 1/2010 | Kuwabara et al. ............ | 382/264 |
| 2010/0019161 A1 * | 1/2010 | Petrick et al. ............ | 250/370.09 |
| 2010/0044711 A1 * | 2/2010 | Imai ................................. | 257/59 |
| 2011/0095169 A1 * | 4/2011 | Takenaka et al. .......... | 250/208.1 |
| 2012/0106698 A1 * | 5/2012 | Karim et al. .................... | 378/37 |

FOREIGN PATENT DOCUMENTS

JP 2002-311144 A 10/2002

* cited by examiner

*Primary Examiner* — David Porta
*Assistant Examiner* — Taeho Jo
(74) *Attorney, Agent, or Firm* — Wolf, Greenfield & Sacks, P.C.

(57) ABSTRACT

An image pickup device includes: an image pickup section including a plurality of pixels; and a drive section reading a signal charge stored in each of the pixels. Each of the pixels includes: a circuit layer including a field-effect transistor, a signal line, and a holding capacitive element; a first electrode provided on the circuit layer and arranged for each of the pixels; a semiconductor layer provided on the first electrode across the pixels, and generating the signal charge based on incident radiation; a second electrode provided on the semiconductor layer; and a third electrode disposed in a region that is between the circuit layer and the semiconductor layer and that is not in opposition to the first electrode, and controlled in voltage by the drive section.

9 Claims, 10 Drawing Sheets

IMAGE PICKUP DEVICE AND IMAGE PICKUP DISPLAY SYSTEM

BACKGROUND

The present disclosure relates to an image pickup device including a photoelectric conversion element and an image pickup display system including such an image pickup device.

Various types of devices have been proposed as an image pickup device that includes the photoelectric conversion element in a pixel (an image pickup pixel). Examples of such an image pickup device as mentioned above include a so-called optical touch panel, a radiation (for example, X-rays) image pickup device, and others.

A so-called indirect conversion type one and a so-called direct conversion type one are available as the radiation image pickup device in the above image pickup devices. In the above-mentioned devices, the indirect conversion type radiation image pickup device is of the type that radiation that has been incident is converted into visible light by wavelength conversion using a scintillator or the like and then the visible light is subjected to photoelectric conversion by a photodiode to obtain a signal charge. On the other hand, the direct conversion type radiation image pickup device is of the type that an amorphous semiconductor ($\alpha$-Se or the like) that generates the signal charge on the basis of the incident radiation is used (for example, see Japanese Unexamined Patent Application Publication No. 2002-311144).

SUMMARY

In the direct conversion type radiation image pickup device, an amorphous as mentioned above is interposed between a pair of electrodes and charges (electrons/holes) that have been generated within a semiconductor layer by applying a voltage between the electrodes are moved to the respective electrodes. An image signal is obtained by reading out the charge (the signal charge) from one electrode (a pixel electrode) using a pixel circuit that includes a field effect transistor, a holding capacitive element, and others.

However, the signal charges are liable to remain in a local region of the semiconductor layer after execution of a reading operation, and the charges so remained may cause a reduction in image quality of a picked-up image. Therefore, it is desired to achieve improvement in image quality by suppressing remaining of the signal charges.

It is desirable to provide an image pickup device capable of achieving improvement in image quality of a picked-up image, and an image pickup display system that includes such an image pickup device.

An image pickup device according to an embodiment of the present disclosure includes: an image pickup section including a plurality of pixels; and a drive section reading a signal charge stored in each of the pixels. Each of the pixels includes: a circuit layer including a field-effect transistor, a signal line, and a holding capacitive element; a first electrode provided on the circuit layer and arranged for each of the pixels; a semiconductor layer provided on the first electrode across the pixels, and generating the signal charge based on incident radiation; a second electrode provided on the semiconductor layer; and a third electrode disposed in a region that is between the circuit layer and the semiconductor layer and that is not in opposition to the first electrode, and controlled in voltage by the drive section.

An image pickup display system according to an embodiment of the present disclosure is provided with an image pickup device and a display device that performs image display based on an image pickup signal obtained by the image pickup device. The image pickup device includes: an image pickup section including a plurality of pixels; and a drive section reading a signal charge stored in each of the pixels. Each of the pixels includes: a circuit layer including a field-effect transistor, a signal line, and a holding capacitive element; a first electrode provided on the circuit layer and arranged for each of the pixels; a semiconductor layer provided on the first electrode across the pixels, and generating the signal charge based on incident radiation; a second electrode provided on the semiconductor layer; and a third electrode disposed in a region that is between the circuit layer and the semiconductor layer and that is not in opposition to the first electrode, and controlled in voltage by the drive section.

In the image pickup device and the image pickup display system according to the above-described embodiments of the present disclosure, when the radiation is incident upon the semiconductor layer in each of the pixels, the signal charge is generated in the semiconductor layer and is stored in the pixel. The signal charge so stored is read out from each of the pixels to obtain a picked-up image based on the incident radiation. Here, the third electrode is disposed in the region that is between the circuit layer and the semiconductor layer and that is not in opposition to the first electrode, and the voltage to be applied to the third electrode is controlled by the drive section. Thus, remaining of the signal charges in a region where an electric field is difficult to reach, such as a region, particularly but not restrictive, between the first electrodes (between the pixels) of the semiconductor layer is suppressed.

According to the image pickup device and the image pickup display system of the above-described embodiments of the present disclosure, the signal charge stored in each of the pixels is read out, thereby obtaining the picked-up image based on the incident radiation. Provision of the third electrode controlled in voltage by the drive section in the region that is between the circuit layer and the semiconductor layer and that is not in opposition to the first electrode allows suppression of remaining of the signal charges in a local region of the semiconductor layer. Therefore, it is possible to achieve improvement in image quality of the picked-up image.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

Figure 5:
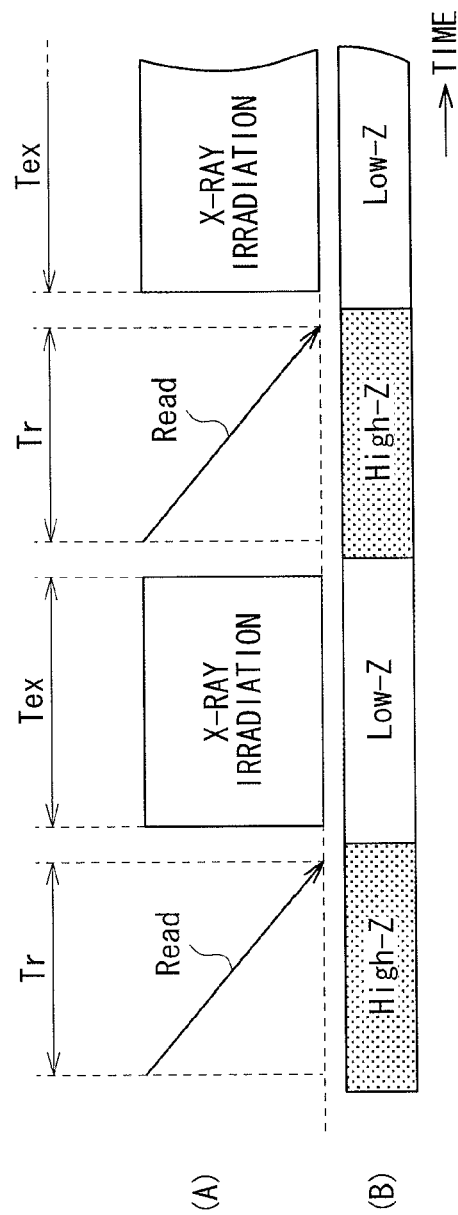

(A) and (B) of FIG. 5 are timing charts illustrating one example of an image pickup driving operation.

Figure 6:
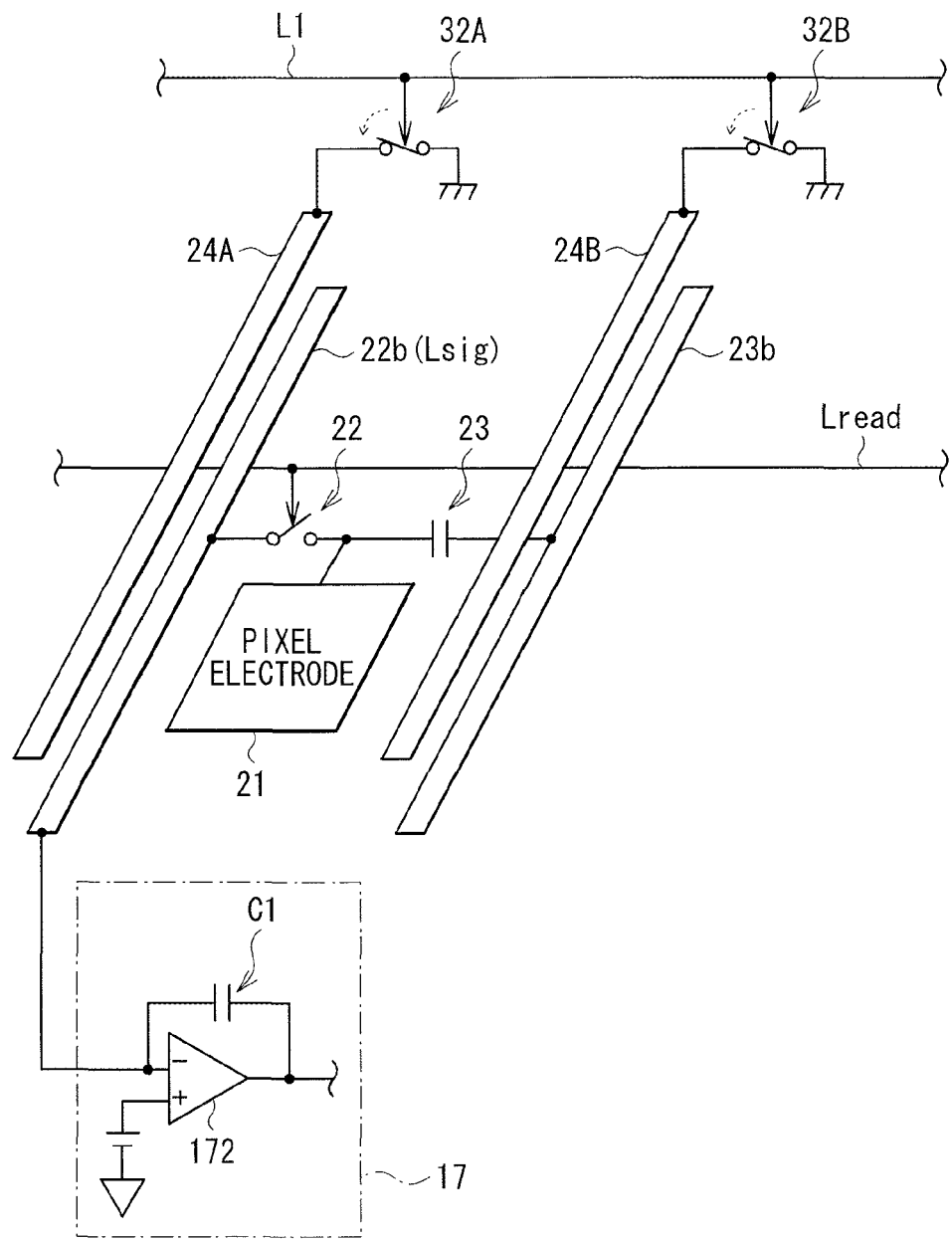

FIG. 6 is a circuit diagram illustrating one example of an operation state in an irradiation term.

Figure 7:
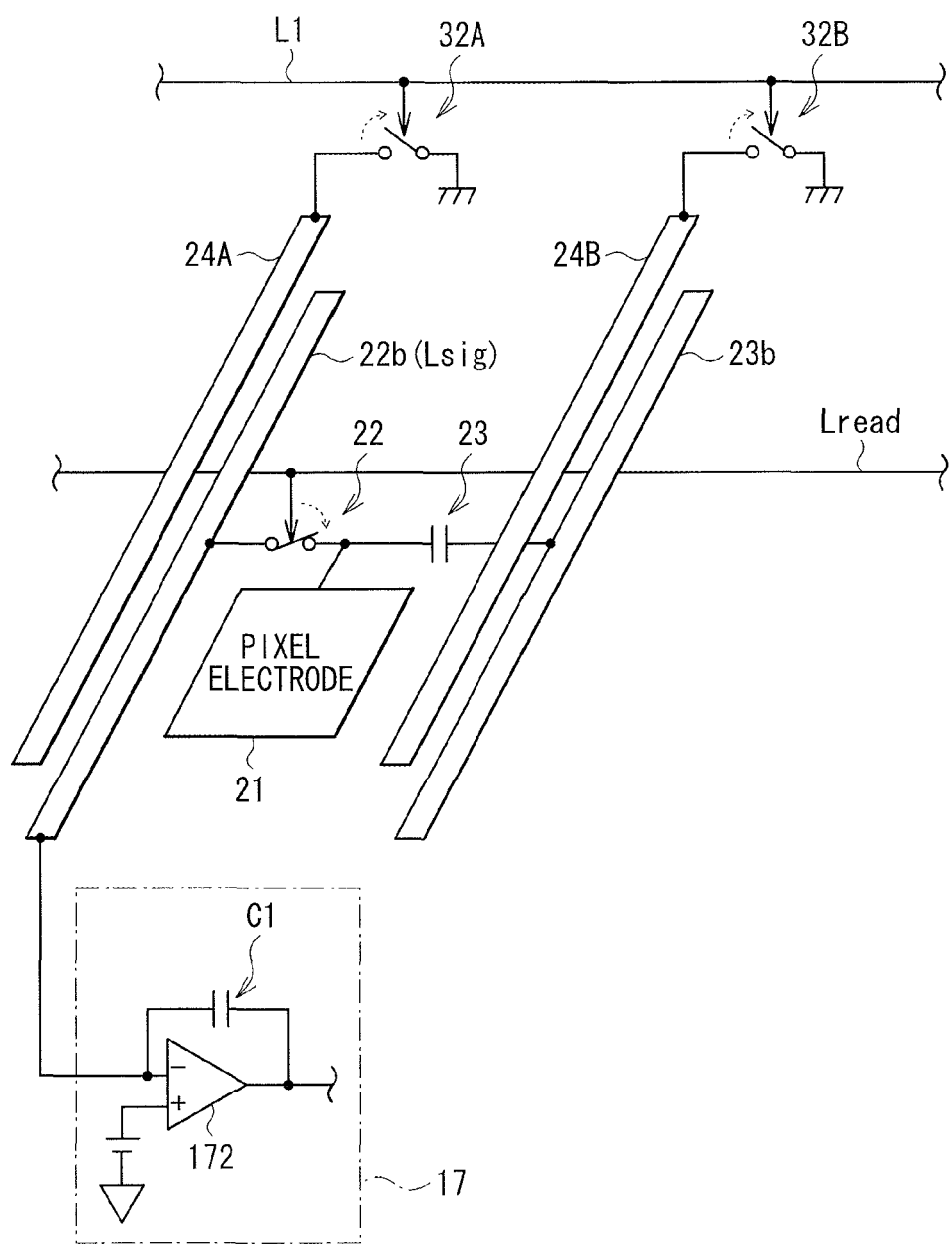

FIG. 7 is a circuit diagram illustrating one example of an operation state in a read term.

Figure 8:
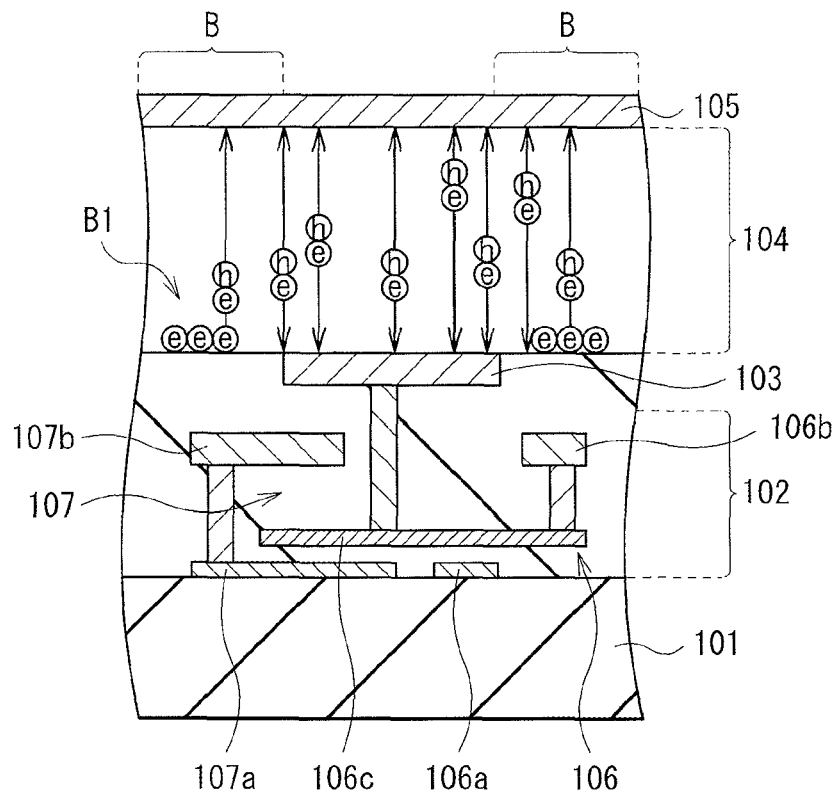

FIG. 8 is a schematic diagram illustrating an example of the behavior of charges after read-out in an image pickup device according to a comparative example.

Figure 1:
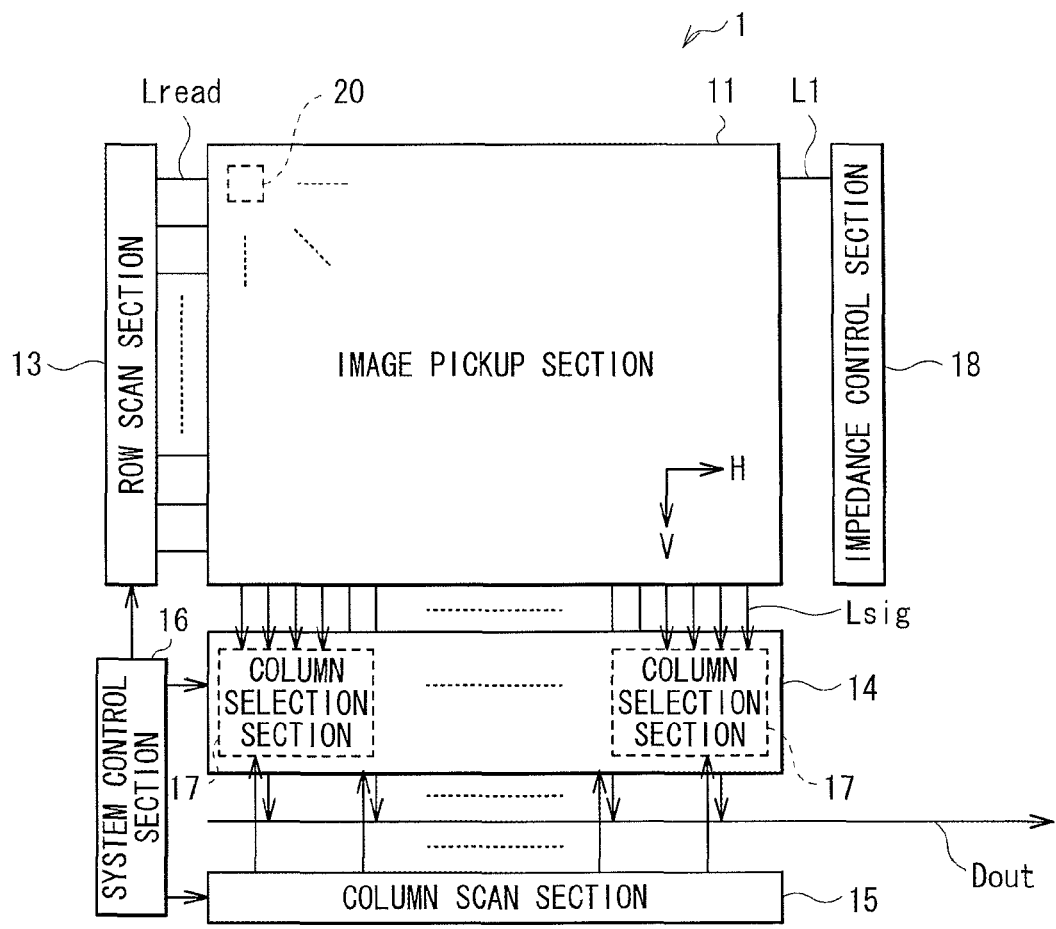
FIG. 1 is a block diagram illustrating an example of a general configuration of an image pickup device according to one embodiment of the present disclosure.
Figure 9:
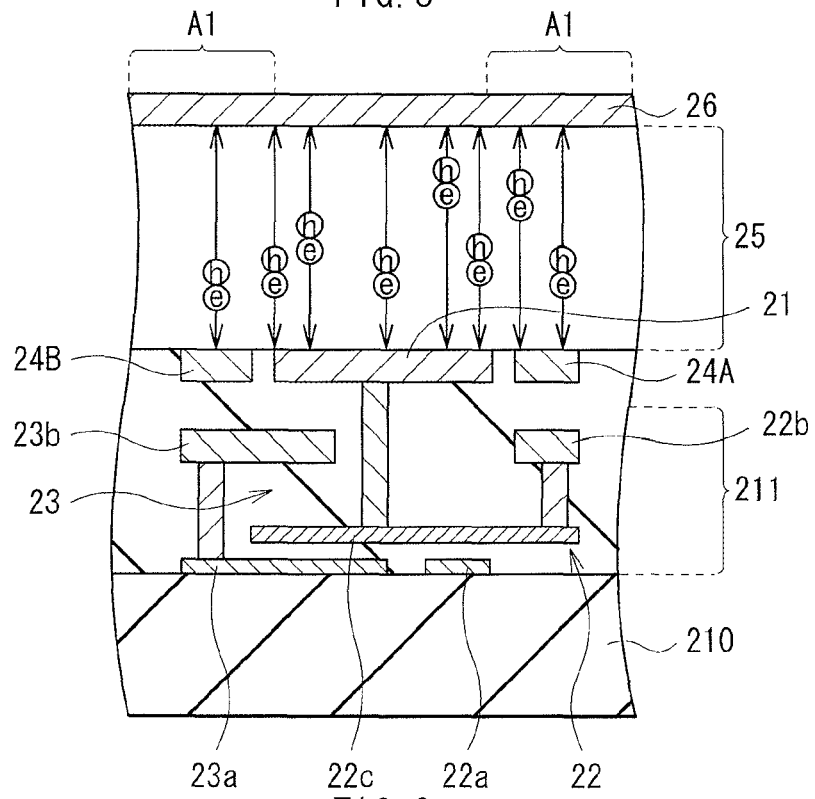

FIG. 9 is a schematic diagram illustrating an example of the behavior of charges after read-out in the image pickup device illustrated in FIG. 1.

Figure 10:
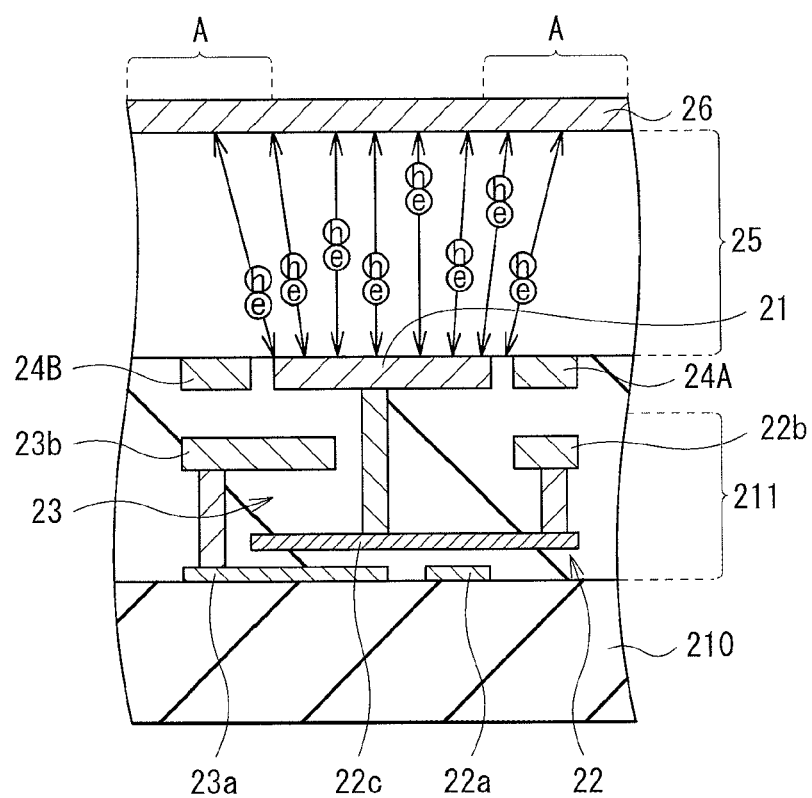

FIG. 10 is a schematic diagram illustrating an example of a voltage controlling operation performed on a charge control electrode of an image pickup device according to a modification example.

Figure 11:
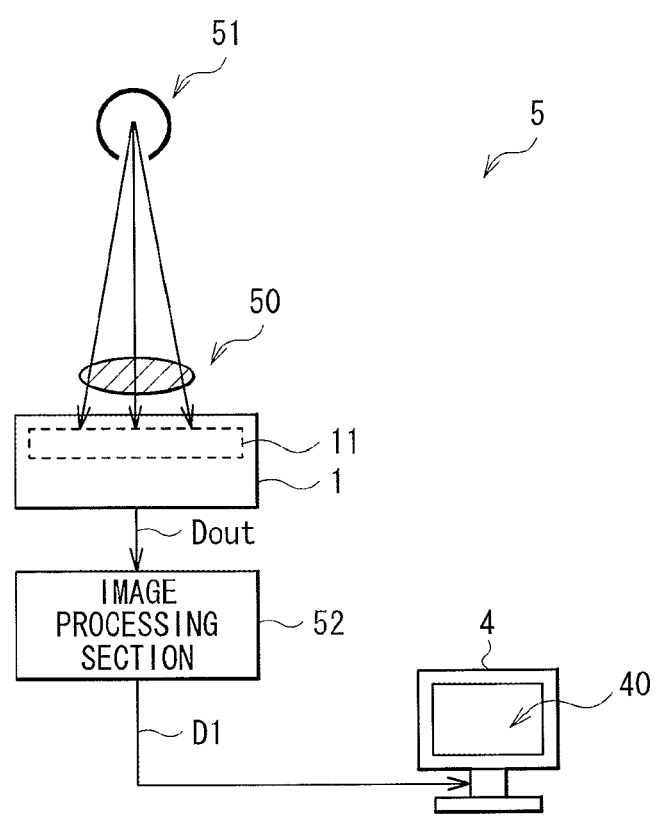

FIG. 11 is a schematic diagram illustrating an example of a schematic configuration of an image pickup display system according to an application example.

DETAILED DESCRIPTION

Some embodiments of the present disclosure will be described in detail with reference to the accompanying drawings. It is to be noted that description will be made in the following order.
1. Embodiment (an example of a radiation image pickup device in which a charge control electrode is disposed between pixels to control the voltage for changing a magnitude of an impedance thereof)
2. Modification Example (another example of the voltage controlling operation of the charge control electrode at low impedance)
3. Application Example (an example of an image pickup display system)

Embodiment

Configuration

FIG. 1 illustrates an example of a general block configuration of an image pickup device (an image pickup device 1) according to one embodiment of the present disclosure. The image pickup device 1 is adapted to read information on an object (to pick up an image of the object) on the basis of incident radiation (for example, X-rays) used and is a so-called direct conversion type radiation image pickup device. The image pickup device 1 includes an image pickup section 11, a row scan section 13, an A/D conversion section 14, a column scan section 15, an impedance control section 18, and a system control section 16. In the above-mentioned sections, the row scan section 13, the A/D conversion section 14, the column scan section 15, the impedance control section 18, and the system control section 16 correspond to one concrete example of a "drive section" in one embodiment of the present disclosure. It is to be noted that in the following, description will be made on the assumption that a horizontal direction (a row direction) within the image pickup section 11 is referred to as an "H" direction and a vertical direction (a column direction) is referred to as a "V" direction.
(Image Pickup Section 11)

Figure 2:
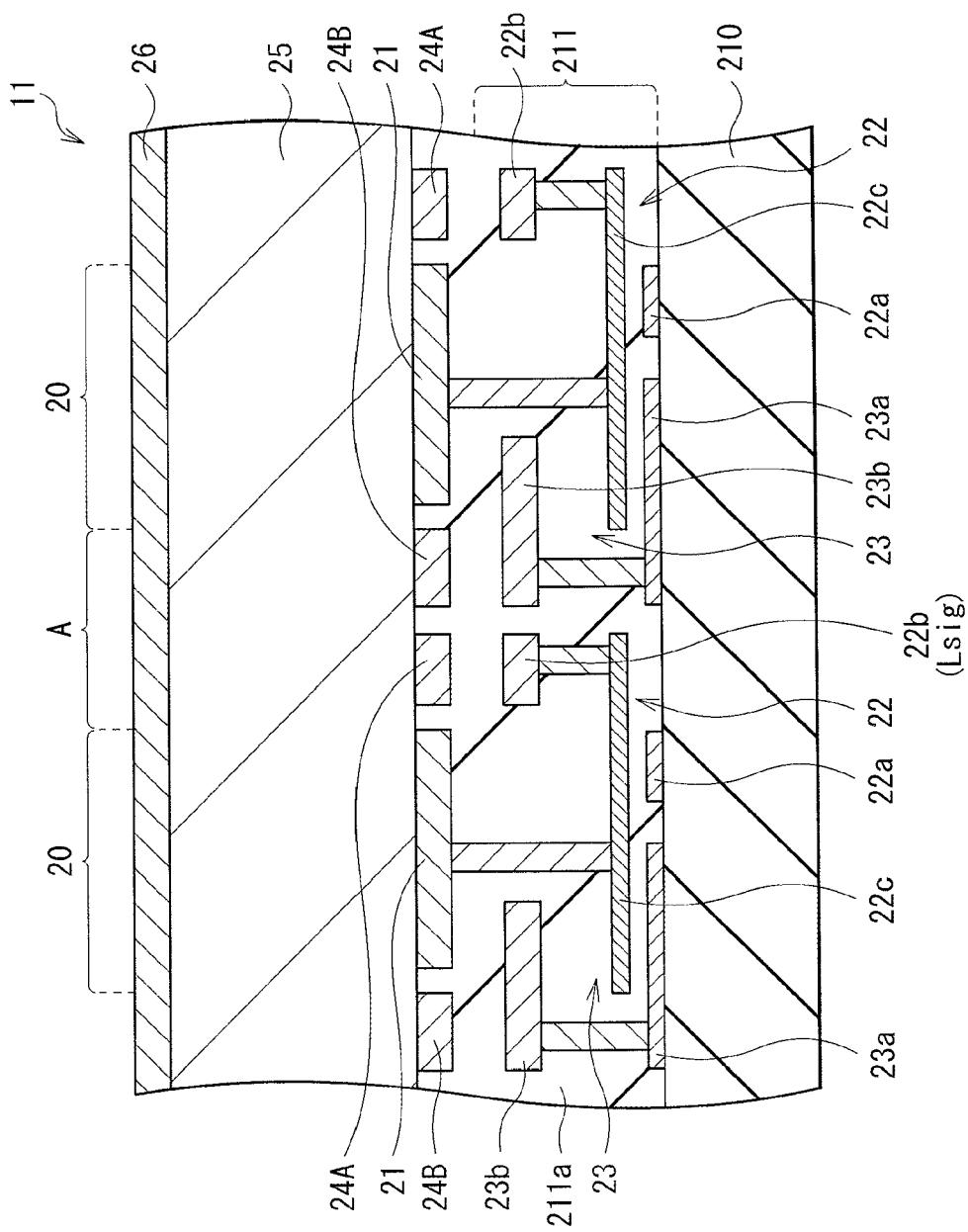
FIG. 2 is a sectional diagram illustrating an example of a schematic configuration of an image pickup section illustrated in FIG. 1.
Figure 3:
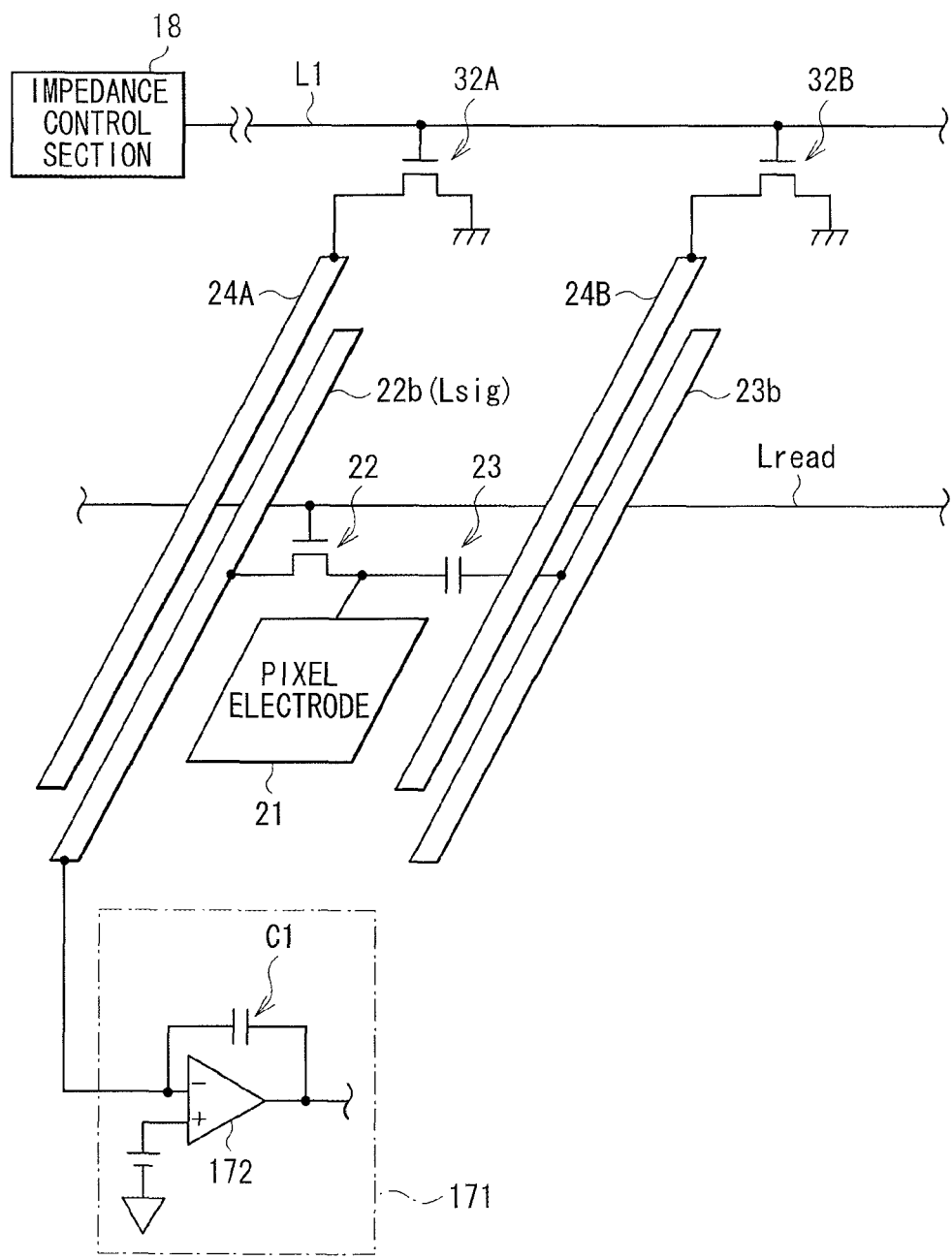
FIG. 3 is a schematic diagram illustrating one example of a layout of a pixel circuit and an electrode.

FIG. 2 illustrates an example of a sectional configuration of the image pickup section 11 with respect two adjacent pixels. FIG. 3 illustrates one example of a layout of a pixel circuit and an electrode together with the impedance control section 18 and a charge amplifier circuit 171 within a later described column selection section 17. The image pickup section 11 generates an electric signal on the basis of radiation that has been incident. In the image pickup section 11, pixels (image pickup pixels or unit pixels) are two-dimensionally arranged in rows and columns (in a matrix). In addition, in the image pickup section 11, a pixel electrode 21 (a first electrode) is disposed on a substrate 210 via a circuit layer 211, and a semiconductor layer 25 is formed on the pixel electrode 21 across the plurality of pixels 20 (over all the pixels). An upper electrode 26 (a second electrode) is disposed on the semiconductor layer 25, for example, over all the pixels.

A pixel circuit (described later) that includes, for example, a TFT (Thin Film Transistor) 22, a signal line electrode 22b (a signal line Lsig), and a holding capacitive element 23 is formed in the circuit layer 211.

The TFT 22 is configured by, for example, an N channel type (N-type) field effect transistor (FFT). Alternatively, the TFT 22 may be configured by a P channel type (P-type) FET or the like. In addition, although a bottom gate structure is illustrated as an example of the structure of the TFT here, the structure is not limited thereto and a top gate structure may be used.

A gate (a gate electrode 22a) of the TFT 22 is connected to a read control line Lread, and one of a source and a drain thereof is connected to, for example, the signal line electrode 22b (the signal line Lsig). The other of the source and the drain is connected to the pixel electrode 21 disposed on the circuit layer 211. A silicon based semiconductor made of, for example, amorphous silicon, microcrystalline silicon, polycrystalline silicon (polysilicon) or the like is used for a channel layer 22c of the TFT 22. Alternatively, an oxide semiconductor made of, for example, indium gallium zinc oxide (InGaZnO), zinc oxide (ZnO) or the like may be used.

The signal line electrode 22b is disposed in a region that is not in opposition to the pixel electrode 21 in the circuit layer 211 (so as not to overlap the pixel electrode 21), for a purpose of making capacitive coupling hardly occur between the signal line electrode 22b and the pixel electrode 21. For example, the signal line electrodes 22b are each extended, for example, along the V direction in a region A between pixels (between the pixel electrodes 21) in the striped form.

The holding capacitive element 23 includes a pair of capacitive electrodes 23a and 23b disposed with a part of an inter-layer insulating film 211a interposed between them and temporarily stores signal charges collected via the pixel electrode 21. In the capacitive electrodes 23a and 23b, the capacitive electrode 23a is disposed in the same layer as, for example, the gate electrode 22a of the TFT 22, and the capacitive electrode 23b is disposed in the same layer as, for example, the signal line electrode 22b. In addition, the capacitive electrodes 23b are each extended, for example, along the V direction in the region A between pixels in the striped form similarly to the signal line electrodes 22b.

The pixel electrodes 21 function as electrodes for taking out, for example, electrons as signal charges from electron-hole pairs generated in the semiconductor layer 25, and are disposed on the circuit layer 211 separated from one another per pixel. The pixel electrode 21 is made of, for example, ITO (indium tin oxide) or the like.

The semiconductor layer 25 is formed by a semiconductor that converts the incident radiation to an electric signal. An example of a semiconductor as mentioned above includes an amorphous semiconductor made of amorphous selenium (a-Se) or the like. Alternatively, it may be formed by a cadmium telluride (CdTe) semiconductor or the like.

The upper electrode 26 is disposed as an electrode that is common among all the pixels and functions as an electrode for discharging the other charge (for example, the hole) in the electron-hole pair generated in the semiconductor layer 25. The upper electrode 26 is made of, for example, Au or the like.

In the present embodiment, electrodes (charge control electrodes 24A and 24B) that are electrically independent of the pixel electrode 21 are disposed in a region that is between the circuit layer 211 and the semiconductor layer 25 and that is not in opposition to the pixel electrode 21 as mentioned above. Concretely speaking, the charge control electrodes 24A and 24B (a third electrode) are disposed in the same layer as the pixel electrode 21 in the region A between the pixels 20 (between the pixel electrodes 21).

The charge control electrodes 24A and 24B are connected to the impedance control section 18 respectively via TFTs 32A and 32B and a control line L1. The TFTs 32A and 32B are field-effect thin-film transistors similarly to the TFT 22, and are disposed in the image pickup section 11 by the same number as the charge control electrodes 24A and 24B. In each of the TFTs 32A and 32B, a gate is connected to the control line L1, one of a source and a drain is connected to the charge control electrodes 24A or 24B, and the other is held at a predetermined potential (for example, a ground potential). The impedance control section 18 is driven to apply a predetermined voltage pulse to each gate of the TFTs 32A and 32B, thereby controlling to change ON operation and OFF operation of the TFTs 32A and 32B. Thus, a magnitude of an impedance of each of the charge control electrodes 24A and 24B is changed at a predetermined timing. The charge control electrodes 24A and 24B so described are made of the same material as, for example, the pixel electrode 21.

In the charge control electrodes 24A and 24B, the charge control electrode 24A is disposed in a region that is in opposition to the signal line electrode 22b, and the charge control electrode 24B is disposed in a region that is in opposition to the holding capacitive element 23. For example, the charge control electrodes 24A are arranged in the striped form along the V direction superimposing on the signal line electrodes 22b, and the charge control electrodes 24B are arranged in the striped form along the V direction superimposing on the capacitive electrodes 23b. Although in the region A between the pixels 20, for example, the signal line electrode 22b and the capacitive electrode 23b are disposed mutually side by side, it is preferable to dispose the charge control electrodes 24A and 24B electrically independently of each other in respective regions facing the signal line electrode 22b and the capacitive electrode 23b as in the present embodiment. Because electrical separation of the charge control electrode 24A from the charge control electrode 25B allows suppression of electrical influence by capacitive coupling on the signal line electrode 22b.

(Row Scan Section 13)

The row scan section 13 is a pixel drive section (a row scan circuit) that includes a shift register circuit, a logic circuit, and others that are not illustrated in the drawing, and performs row-by-row (in units of horizontal lines) driving (line sequential scanning) on the plurality of pixels 20 in the image pickup section 11. Concretely speaking, the row scan section 13 performs an image picking-up operation including a later-described reading operation and others by, for example, line sequential scanning. It is to be noted that the line sequential scanning is performed by supplying a row scan signal to each pixel 20 via the read control line Lread.

(A/D Conversion Section 14)

The A/D conversion section 14 includes the plurality of column selection sections 17 one being disposed for every plurality (here, four) of signal lines Lsig, and performs A/D conversion (analog-to-digital conversion) on the basis of the signal voltage (the signal charge) that has been input via the signal line Lsig. Thus, output data Dout (the image pickup signal) in a form of digital signal is generated and output to the outside.

Figure 4:
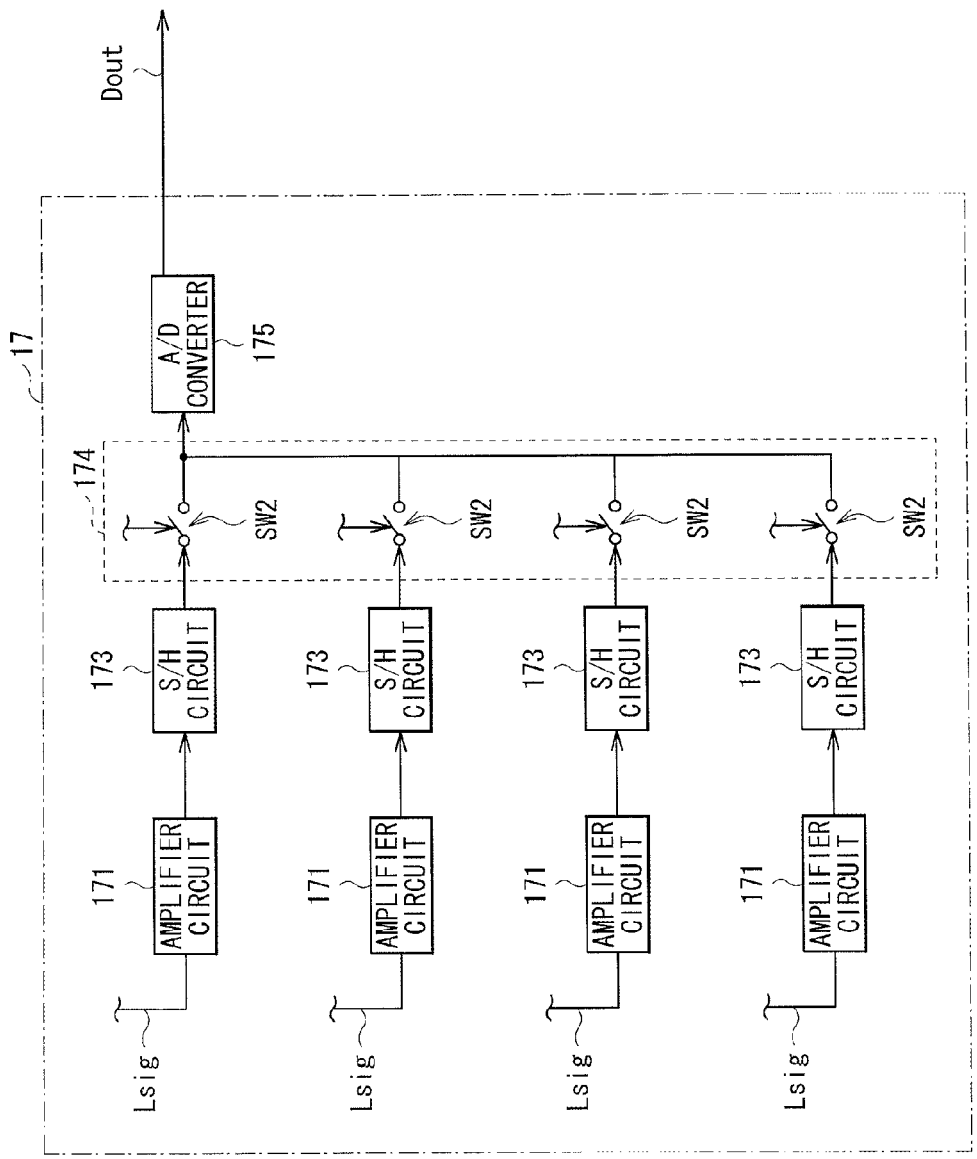
FIG. 4 is a block diagram illustrating an example of a detailed configuration of a column selection section illustrated in FIG. 1.

The column selection section 17 includes the charge amplifier circuit 171, a sample/hold (S/H) circuit 173, a multiplexer circuit (a selection circuit) 174 including four switches SW2, and an A/D converter 175, for example, as illustrated in FIG. 4. In the above-mentioned elements, the charge amplifier circuit 171, the S/H circuit 173, and the switch SW2 are respectively disposed for each signal line Lsig. The multiplexer circuit 174 and the A/D converter 175 are disposed for each column selection section 17.

The charge amplifier circuit 171 includes a charge amplifier 172 and a capacitive element (a capacitor or a feedback capacitive element) C1. The charge amplifier 172 is an amplifier for converting the signal charge read out from the signal line Lsig into a voltage (Q-V conversion).

The S/H circuit 173 is a circuit that is disposed between the charge amplifier 172 and the multiplexer circuit 174 (the switch SW2) and adapted to temporarily hold an output voltage Vca from the charge amplifier 172.

The multiplexer circuit 174 is a circuit that selectively connects each S/H circuit 173 and the A/D converter 175 with each other or disconnects them from each other by sequentially bringing the four switches into the ON state one by one in accordance with scan driving by the column scan section 15.

The A/D converter 175 is a circuit that generates and outputs the above-mentioned output data Dout by performing A/D conversion on the output voltage that has been input from the S/H circuit 173 via the switch SW2.

(Column Scan Section 15)

The column scan section 15 includes, for example, a shift register, an address decoder and others that are not illustrated in the drawing, and drives in order the respective switches SW2 in the above-mentioned column selection section 17 while scanning the switches SW2. The signals (the above-mentioned output data Dout) of the respective pixels 20 so read out via the respective signal lines Lsig are output to the outside in order by selective scanning performed by the column scan section 15 configured as mentioned above.

(Impedance Control Section 18)

The impedance control section 18 includes a logic circuit and others that are not illustrated in the drawing, and controls the voltages to be applied to the plurality of charge control electrodes 24A and 24B in the image pickup section 11 to control the magnitude of impedances of the charge control electrodes 24A and 24B. It is good enough for the impedance control section 18 to be connected with at least one control line L1, and such one control line L1 is connected to each of the charge control electrodes 24A and 24B via the TFTs 32A and 32B. Thus, the impedance control section 18 controls the voltages of all the charge control electrodes 24A and 24B disposed in the image pickup section 11 in the lump.

(System Control Section 16)

The system control section 16 controls the operations of the row scan section 13, the A/D conversion section 14, the column scan section 15, and the impedance control section 18. Concretely speaking, the system control section 16 includes a timing generator that generates the above-mentioned various timing signals (control signals), and controls driving of the row scan section 13, the A/D conversion section 14, the column scan section 15, and the impedance control section 18 on the basis of the various timing signals generated by the timing generator. Although details will be described later, the row scan section 13, the A/D conversion section 14, and the column scan section 15 drive each pixel 20 to pick up an image, and the impedance control section 18 controls the voltages to be applied to the charge control electrodes 24A and 24B, on the basis of the control by the system control section 16 when the image is to be picked up.

Operations and Effects

In the image pickup device 1 according to the present embodiment, when the radiation is incident upon the image pickup section 11, the radiation is converted into the signal charge in the semiconductor layer 25 in each pixel 20 (the signal charge based on the incident radiation is generated in the semiconductor layer 25). Speaking in details, the electron-hole pairs of the number corresponding to the amount of radiation that has been incident are generated in the semiconductor layer 25 when the radiation is applied. In that occasion, for example, the electron as the signal charge moves toward the pixel electrode 21 and the hole moves toward the upper electrode 26 respectively by application of a predetermined bias voltage (a minus voltage) to the upper electrode 26. In the electron and hole so moved, the signal charge is stored in the holding capacitive element 23 via the pixel electrode 21, and is then read out onto the signal line Lsig when the TFT 22 enters the ON state in execution of the reading operation. The signal charge so read-out is subjected to Q-V conversion and A/D conversion and then is output to the outside after having been subjected to Q-V conversion and A/D conversion. In the following, this image pickup driving operation will be described in detail.

(A) and (B) of FIG. 5 are schematic diagrams illustrating one example of the image pickup driving operation. FIG. 6 illustrates one operational example of the pixel 20 and the charge amplifier circuit 171 in the column selection section 17 in a term for irradiation (an irradiation term Tex) with radiation (here, X-rays). FIG. 7 illustrates an operational example of the pixel 20 and the charge amplifier circuit 171 in the column selection section 17 in a read term (a read term Tr). It is to be noted that the ON and OFF states of the TFTs 22, 32A, and 32B are illustrated in switches in FIG. 6 and FIG. 7 for the convenience of description.

As illustrated in (A) of FIG. 5, the signal charges are line sequentially read out from the respective pixels 20 in the image pickup section 11 in the read term Tr that comes after the radiation irradiation term Tex in the image pickup device 1. It is to be noted that an arrow in the read term Tr indicates that the reading operation is performed line sequentially from the pixel on an upper part in a screen toward the pixel on a lower part, and the term taken for reading the signals charges on the entire screen is referred to as the "read term".

In the present embodiment, the voltages to be applied to the charge control electrodes 24A and 24B are controlled to change the magnitude of the impedances of the charge control electrodes 24A and 24B together with execution of line sequential image pickup driving as mentioned above as illustrated in (B) of FIG. 5. Concretely speaking, the voltages are so controlled that a low impedance (Low-Z) is attained in the irradiation term Tex and a high impedance (High-Z) is attained in the read term Tr.

Describing in detail, the TFT 22 is in the OFF state in the irradiation term Tex as illustrated in FIG. 6. In this state, the signal charge that is based on the radiation incident upon the semiconductor layer 25 in the pixel 20 is not output toward the signal line Lsig (not read out) and is stored in the holding capacitive element 23. In the irradiation term Tex, an ON voltage (a High-side voltage pulse) is applied to the TFTs 32A and 32B via the control line L1 to bring the TFTs 32A and 32B into the ON state. Thus, the charge control electrodes 24A and 24B are held in a state where the voltage is applied (voltage-applied state) to attain the low impedance.

Then, the TFT 22 enters the ON state in the read term Tr as illustrated in FIG. 7, by which the signal charge is read out from the holding capacitive element 23 onto the signal line Lsig. In the read term Tr, an OFF voltage (a Low-side voltage pulse) is applied to the TFTs 32A and 32B via the control line L1 to bring the TFTs 32A and 32B into the OFF state. Thus, the charge control electrodes 24A and 24B are held in a state where the voltage is not applied (floating state) to attain the high impedance.

The signal charges so read are input into the charge amplifier circuit 171. Describing in detail, the read signal charges are input into the column selection section 17 in the A/D conversion section 14 in units of a plurality (here, four) of lines of pixels via the signal line Lsig. In the column selection section 17, first, the input signal charge is Q-V converted (converted from the signal charge into a signal voltage) in the charge amplifier circuit 171 for each signal line Lsig. Next, the signal voltage so converted is A/D converted by the A/D converter 175 via the S/H circuit 173 and the multiplexer circuit 174. The output data Dout (the image pickup signal) in a form of digital signal is generated and output from each column selection section 17 in the above-mentioned manner. The output data Dout is transferred to the outside or is stored in an internal memory that is not illustrated in the drawing. The image pickup driving operation is performed in above-mentioned manner in the image pickup device 1.

Comparative Example

Here, the behavior of a charge in a pixel in the irradiation term Tex of an image pickup device according to a comparative example is illustrated in FIG. 8. In the image pickup device according to the comparative example, a circuit layer 102 that includes a TFT 106, a signal line electrode 106b, and a holding capacitive element 107 is disposed on a substrate 101, and a pixel electrode 103 is disposed on the circuit layer 102 in each pixel as in the present embodiment. A semiconductor layer 104 is formed on the pixel electrode 103 across all the pixels and an upper electrode 105 is formed on the semiconductor layer 104. It is to be noted that in the comparative example, a region (a region not in opposition to the pixel electrode 103) B where the pixel electrode 103 is not formed is present in a region (a region in opposition to the signal line electrode 106b and the holding capacitive element 107) between the pixels.

Also in this comparative example, in a pair of a hole (designated by "h" in the drawing) and an electron (designated by "e" in the drawing) that have been generated on the basis of the incident radiation, the electron as the signal charge moves toward the pixel electrode 103, the hole moves toward the upper electrode 105, and the signal charge is stored in the holding capacitive element 107, in the irradiation term Tex as in the present embodiment. Then, in the read term Tr, the signal charge stored in the holding capacitive element 107 is read out onto a not-illustrated signal line. However, since the region B in the semiconductor layer 104 in each pixel is weaker in electric field than the region in opposition to the pixel electrode 103, the signal charges are remained (B1 in the drawing) in the semiconductor layer 104 even after execution of the reading operation.

On the other hand, in the present embodiment, the charge control electrodes 24A and 24B controlled in voltage by the impedance control section 18 are disposed in the region (the region A between the pixels) that is between the semiconductor layer 25 and the circuit layer 211 and that is not in opposition to the pixel electrode 21. Concretely speaking, the voltages are controlled such that the magnitude of the impedances of the charge control electrodes 24A and 24B is changed at a predetermined timing (such control that the impedance is set low in the irradiation term Tex and the impedance is high in the read term Tr is made).

The electric field is applied also to a part A1 that is in opposition to the charge control electrode 24A or 24B in the semiconductor layer 25, by holding the charge control electrodes 24A and 24B at the low impedances in the irradiation term Tex as described above. One of the electron and the hole in each electron-hole pair generated in the part A1 moves toward the upper electrode 26 and the other moves toward the charge control electrode 24A or 24B. Thus, the charges are discharged to the outside of the pixel 20 through the charge control electrodes 24A and 24B (FIG. 9). On the other hand, the holes generated in the semiconductor layer 25 are discharged to the outside of the pixel 20 through the upper electrode 26. It is to be noted that such discharge of the charges through the charge control electrodes 24A and 24B is performed continuously in the irradiation term Tex (the term during which the charge control electrodes are held at the low impedances). Thus, remaining of the signal charges in the part A1 is suppressed. In addition, the capacitances of the charge control electrodes 24A and 24B are reduced and capacitive coupling with the signal line electrode 22B is reduced by holding the charge control electrodes 24A and 24B at the high impedances (by bringing the charge control electrodes 24A and 24B into the floating state) in the read term Tr.

In the present embodiment, when the radiation is incident upon the semiconductor layer 25 of each pixel 20, the signal charges are generated in the semiconductor layer 25 and are stored in the pixel 20 as described in the foregoing. It is allowed to obtain the picked-up image that is based on the incident radiation by reading out the stored signal charge from each pixel 20. The charge control electrodes 24A and 24B are disposed in the region (the region A) that is between the circuit layer 211 and the semiconductor layer 25 and that is not in opposition to the pixel electrode 21, and the charge control electrodes 24A and 24B are controlled in voltage. Thus, it is allowed to suppress remaining of the signal charges in a region where the electric field is difficult to reach, such as a region, particularly but not restrictive, between the pixel electrodes 21 in the semiconductor layer 25. Thus, it is allowed to suppress generation of noise caused by remaining of the signal charges, thereby to achieve improvement in image quality of the picked-up image.

Concretely speaking, it is allowed to control so as not to let the signal charges remain within the semiconductor layer 25 after the read term Tr while efficiently accumulating the signal charges in the irradiation term Tex by holding the charge control electrodes 24A and 24B at the low impedances in the irradiation term Tex and holding the charge control electrodes 24A and 24B at the high impedances in the read term Tr.

In addition, it is also allowed to reduce capacitive coupling between the signal line electrode 22b and each of the charge control electrodes 24A and 24B by holding the charge control electrode 24A at the high impedance in the read term Tr. Although a reduction in reading speed caused by capacitive coupling is feared because the charge control electrode 24A is disposed to oppose the signal line electrode 22b in the region A, when the charge control electrode 24A is held at the high impedance in the read term Tr as in the present embodiment, the capacitances of the charge control electrodes 24A and 24B are reduced and hence it is allowed to suppress the reduction in reading speed. In addition, since it is allowed to arrange the charge control electrodes 24A and 24B by superimposing them on the signal line electrode 22b and the holding capacitive element 23 owing to the above, a reduction in area of the pixel electrode and additional preparation of an electrode installation space between the electrodes are avoided and hence the influence on the aperture ratio is little.

Next, a modification example of the image pickup device according to the above-mentioned embodiment will be described. The same numerals are assigned to the same constitutional elements as those in the above embodiment and description thereof will be omitted.

Modification Example

FIG. 10 is a schematic diagram illustrating an example of a voltage controlling operation to be performed on the charge control electrodes 24A and 24B of an image pickup device according to the modification example. Also in this modification example, the charge control electrodes 24A and 24B are disposed in the region between the semiconductor layer 25 and the circuit layer 211 and not in opposition to the pixel electrode 21 as in the embodiment described above. Also, in execution of the image pickup driving operation, control to change the magnitude of the impedance is performed such that the charge control electrode 24A is set at a low impedance in the irradiation term Tex and the charge control electrode 24B is set at a high impedance in the read term Tr.

It is to be noted that, in this modification example, such voltage control is performed that the signal charge exhibits the behavior as illustrated in FIG. 10 when the charge control electrode 24A is to be held at the low impedance in the irradiation term Tex. That is, such an electric field that acts to move the signal charge generated in the region A in the semiconductor layer 25 toward the pixel electrode 21 is formed by causing the charge control electrodes 24A and 24B to be held in a predetermined voltage-applied state. Concretely speaking, a bias voltage (a minus voltage) is applied to the upper electrode 26 to set the voltages to be applied to the charge control electrodes 24A and 24B lower than the voltage to be applied to the pixel electrode 21. Thus, the signal charges generated in the semiconductor layer 25 become liable to be gathered toward the pixel electrode 21. Therefore, it becomes hard for the signal charges to remain in the region A and efficiency of collecting the charges from the pixel electrode 21 is also increased.

The image pickup devices according to the above-mentioned embodiment and modification example are utilized as various types of radiation image pickup devices that obtain electric signals on the basis of the incident radiation. As the radiation image pickup device, it is applicable to, for example, medical X-ray image pickup devices (Digital Radiography and others), X-ray image pickup devise for hand baggage search used in airports and other places, industrial X-ray image pickup devices (for example, devices for use in examination for dangerous goods in containers and inspection of the inside of a bag), and any other suitable x-ray image pickup devices.

Application Example

The image pickup devices according to the present embodiment and modification example are applicable to an image pickup display system as described in the following.

FIG. 11 schematically illustrates a schematic configuration example of an image pickup display system (an image pickup display system 5) according to the application example. The image pickup display system 5 includes: the above-mentioned image pickup device 1 including the image pickup section 11; an image processing section 52; and a display device 4, and is configured as an image pickup display system (a radiation image pickup display system) using radiation in this example.

The image processing section 52 performs predetermined image processing on the output data Dout (the image pickup signal) output from the image pickup device 1 to generate the image data D1. The display device 4 performs image display based on the image data D1 generated by the image processing section 52 on a predetermined monitor screen 40.

In the image pickup display system 5, the image pickup device 1 (here, the radiation image pickup device) acquires the image (output) data Dout of an object 50 on the basis of irradiation light (here the radiation) that has been applied from a light source (here, a radiation source such as an X-ray source) toward the object 50, and outputs the data to the image processing section 52. The image processing section 52 performs the above-mentioned predetermined signal processing on the input image data Dout, and outputs the image data (display data) D1 so subjected to the image processing to the display device 4. The display device 4 displays image information (the picked up image) on the monitor screen 40 on the basis of the input image data D1.

Since the image pickup display system 5 of the present application example is allowed to acquire the image of the object 50 as an electric signal in the image pickup device 1, image display is allowed by transferring the acquired electric signal to the display device 4. That is, it is possible to observe the image of the object 50 without using such a radiographic film as ever used and it is also possible to cope with moving-image capturing and moving-image display.

It is to be noted that although description has been made by giving a case that the image pickup device 1 is configured as the radiation image pickup device and is applied to the image pickup display system of the type using the radiation as an example in the application example, the image pickup display system according to any embodiment of the present disclosure is also applicable to systems that use other types of image pickup devices.

Although the example embodiment, the modification example, and the application example of the present disclosure have been given as mentioned above, the contents of the present disclosure are not limited to the above-mentioned embodiment and others, and may be modified in a variety of ways. For example, the circuit configuration of the pixel in the image pickup section is not limited to those (the circuit configurations of the pixels 20 in the embodiment and others) and the pixels may have other circuit configurations. The circuit configurations of the row scan section, the column selection section, and others are not limited to those described in the above-mentioned embodiment and others, and the row scan section, the column selection section, and others may have other circuit configurations similarly.

In addition, the image pickup section, the row scan section, the A/D conversion section (the column selection section), the column scan section, and others that have been described in the above-mentioned embodiment and others may be formed, for example, on the same (one) substrate. Concretely speaking, it is possible to form also switches and others in circuit parts of the above-mentioned sections on the same substrate by using a polycrystalline semiconductor made of, for example, low-temperature polycrystalline silicon or the like. Thus, for example, it is possible to perform the driving operation on the same substrate on the basis of a control signal sent from an external system control section, and hence it is possible to achieve a slim bezel (a three-sided free bezel structure) and improvement in reliability in wiring connection.

Further, although description has been made by giving the structure that the charge control electrodes 24A and 24B are disposed in the region A between the pixels in the striped form along the V direction as an example in the above-mentioned embodiment and others, the plane shape of the charge control electrodes 24A and 24B and the region where the charge control electrodes 24A and 24B are installed are not limited to the above. For example, the charge control electrodes 24A and 24B may be disposed in the striped form along the H direction or may be disposed so as to surround a peripheral edge of the pixel electrode 21 (like a grating as a whole).

In addition, although the configuration that the charge control electrode 24A is disposed to oppose the signal line electrode 22*b* and the charge control electrode 24B is disposed to oppose the holding capacity element 23 so as to be electrically independent of each other has been illustrated in the above-mentioned embodiment and others, the charge control electrodes 24A and 24B may be disposed integrally. That is, when the signal line electrode 22*b* and the holding capacitive element 23 (the capacitive electrode 23*b*) are disposed side by side in the region A, one charge control electrode that is in opposition to both of the signal line electrode 22*b* and the holding capacitive element 23 may be disposed. It is to be noted that it is desirable to electrically separate the charge control electrodes 24A and 24B from each other as described in the above-mentioned embodiment and others from the viewpoint of reducing the capacitive coupling with the signal line electrode 22*b*.

Furthermore, the technology encompasses any possible combination of some or all of the various embodiments and the modifications described herein and incorporated herein.

It is possible to achieve at least the following configurations from the above-described example embodiments, the modifications, and the application example of the disclosure.

(1) An image pickup device, including:
an image pickup section including a plurality of pixels; and
a drive section reading a signal charge stored in each of the pixels,
wherein each of the pixels includes
a circuit layer including a field-effect transistor, a signal line, and a holding capacitive element,
a first electrode provided on the circuit layer and arranged for each of the pixels,
a semiconductor layer provided on the first electrode across the pixels, and generating the signal charge based on incident radiation,
a second electrode provided on the semiconductor layer, and
a third electrode disposed in a region that is between the circuit layer and the semiconductor layer and that is not in opposition to the first electrode, and controlled in voltage by the drive section.

(2) The image pickup device according to (1), wherein the drive section changes a magnitude of an impedance of the third electrode by controlling the voltage to be applied to the third electrode.

(3) The image pickup device according to (2), wherein the drive section controls the voltage to be applied to the third electrode to cause the impedance of the third electrode in a read term of the signal charge to be higher than the impedance of the third electrode in an irradiation term of the radiation.

(4) The image pickup device according to (3), wherein the drive section causes, in the read term, the third electrode to be held in a state where the voltage is not applied, and causes, in the irradiation term, the third electrode to be held in a state where the voltage is applied.

(5) The image pickup device according to (4), wherein the drive section controls the voltage to be applied to the third electrode to cause the signal charge, generated in a part that is in opposition to the third electrode in the semiconductor layer, to move toward the first electrode in the irradiation term.
(6) The image pickup device according to any one of (1) to (5), wherein the third electrode is disposed in a same layer as the first electrode.
(7) The image pickup device according to any one of (1) to (5), wherein the region in which the third electrode is disposed is located between the pixels.
(8) The image pickup device according to (7), wherein
the pixels are disposed two-dimensionally in matrix, and
the third electrode includes a plurality of third electrodes, and the third electrodes are provided in a striped form along a direction in which the pixels are arrayed.
(9) The image pickup device according to any one of (1) to (8), wherein the third electrode is disposed in opposition to the signal line and the holding capacitive element.
(10) The image pickup device according to any one of (1) to (9), wherein the radiation includes X-ray.
(11) An image pickup display system with an image pickup device and a display device that performs image display based on an image pickup signal obtained by the image pickup device, the image pickup device including:
an image pickup section including a plurality of pixels; and
a drive section reading a signal charge stored in each of the pixels,
wherein each of the pixels includes
a circuit layer including a field-effect transistor, a signal line, and a holding capacitive element,
a first electrode provided on the circuit layer and arranged for each of the pixels,
a semiconductor layer provided on the first electrode across the pixels, and generating the signal charge based on incident radiation,
a second electrode provided on the semiconductor layer, and
a third electrode disposed in a region that is between the circuit layer and the semiconductor layer and that is not in opposition to the first electrode, and controlled in voltage by the drive section.

The disclosure contains subject matter related to that disclosed in Japanese Priority Patent Application JP2012-072895 filed in the Japan Patent Office on Mar. 28, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup device, comprising:
an image pickup section including a plurality of pixels; and
a drive section reading a signal charge stored in each of the pixels,
wherein each of the pixels includes
a circuit layer including a field-effect transistor, a signal line, and a holding capacitive element,
a first electrode provided on the circuit layer and arranged for each of the pixels,
a semiconductor layer provided on the first electrode across the pixels, and generating the signal charge based on incident radiation,
a second electrode provided on the semiconductor layer, and
a third electrode disposed in a region that is between the circuit layer and the semiconductor layer and that is not in opposition to the first electrode, and controlled in voltage by the drive section,
wherein the drive section changes a magnitude of an impedance of the third electrode by controlling the voltage to be applied to the third electrode.

2. The image pickup device according to claim 1, wherein the drive section controls the voltage to be applied to the third electrode to cause the impedance of the third electrode in a read term of the signal charge to be higher than the impedance of the third electrode in an irradiation term of the radiation.

3. The image pickup device according to claim 2, wherein the drive section causes, in the read term, the third electrode to be held in a state where the voltage is not applied, and causes, in the irradiation term, the third electrode to be held in a state where the voltage is applied.

4. The image pickup device according to claim 3, wherein the drive section controls the voltage to be applied to the third electrode to cause the signal charge, generated in a part that is in opposition to the third electrode in the semiconductor layer, to move toward the first electrode in the irradiation term.

5. The image pickup device according to claim 1, wherein the third electrode is disposed in a same layer as the first electrode.

6. The image pickup device according to claim 1, wherein the region in which the third electrode is disposed is located between the pixels.

7. The image pickup device according to claim 6, wherein
the pixels are disposed two-dimensionally in matrix, and
the third electrode comprises a plurality of third electrodes, and the third electrodes are provided in a striped form along a direction in which the pixels are arrayed.

8. The image pickup device according to claim 1, wherein the third electrode is disposed in opposition to the signal line and the holding capacitive element.

9. The image pickup device according to claim 1, wherein the radiation comprises X-ray radiation.

* * * * *